United States Patent
Kaynak et al.

(10) Patent No.: US 10,860,416 B2
(45) Date of Patent: *Dec. 8, 2020

(54) TIERED ERROR CORRECTION CODE (ECC) OPERATIONS IN MEMORY

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/424,836

(22) Filed: May 29, 2019

(65) Prior Publication Data

US 2019/0278654 A1 Sep. 12, 2019

Related U.S. Application Data

(63) Continuation of application No. 15/461,672, filed on Mar. 17, 2017, now Pat. No. 10,331,514.

(51) Int. Cl.
*G11C 29/00* (2006.01)
*G06F 11/10* (2006.01)
(Continued)

(52) U.S. Cl.
CPC ...... *G06F 11/1044* (2013.01); *G06F 11/1012* (2013.01); *H03M 13/1125* (2013.01); *H03M 13/152* (2013.01); *H03M 13/2912* (2013.01); *H03M 13/2927* (2013.01); *H03M 13/2948* (2013.01); *H03M 13/3715* (2013.01); *H03M 13/6566* (2013.01)

(58) Field of Classification Search
CPC .......... G06F 11/1044; H03M 13/1125; H03M 13/6566; H03M 13/2909; H03M 13/2942; H03M 13/2963; H03M 13/098; H03M 13/152; H03M 13/1108; H03M 13/3715; H03M 13/1111; G11C 29/52
See application file for complete search history.

(56) References Cited

U.S. PATENT DOCUMENTS 8,495,465 B1 7/2013 Anholt et al.
9,128,859 B1 9/2015 Yang
(Continued)

OTHER PUBLICATIONS

International Search Report and Written Opinion from related international application No. PCT/US2018/021639, dated Jun. 21, 2018, 15 pages.

(Continued)

*Primary Examiner* — Guerrier Merant
(74) *Attorney, Agent, or Firm* — Brooks, Cameron & Huebsch, PLLC

(57) ABSTRACT

Apparatuses and methods for performing an error correction code (ECC) operation are provided. One example method can include performing a first error code correction (ECC) operation on a portion of data, performing a second ECC operation on the portion of data in response to the first ECC operation failing, and performing a third ECC operation on the portion of data in response to the second ECC operation failing.

20 Claims, 5 Drawing Sheets

(51) Int. Cl.
    *H03M 13/29*     (2006.01)
    *H03M 13/37*     (2006.01)
    *H03M 13/11*     (2006.01)
    *H03M 13/15*     (2006.01)
    *H03M 13/00*     (2006.01)

(56) References Cited

U.S. PATENT DOCUMENTS

| | | |
|---|---|---|
| 10,331,514 B2 * | 6/2019 | Kaynak .............. H03M 13/3715 |
| 2009/0276689 A1 | 11/2009 | Tan |
| 2011/0219284 A1 | 9/2011 | Uchikawa |
| 2012/0317460 A1 | 12/2012 | Chilappagari et al. |
| 2013/0151923 A1 | 6/2013 | Han |
| 2013/0346824 A1 | 12/2013 | Bolotov |
| 2015/0155888 A1 | 6/2015 | Moon et al. |
| 2016/0112068 A1 | 4/2016 | Kim |
| 2016/0164543 A1 | 6/2016 | Kumar |
| 2016/0179615 A1 | 6/2016 | Lee |
| 2016/0274970 A1 | 9/2016 | Earhart |
| 2016/0315635 A1 | 10/2016 | Cai et al. |
| 2016/0371144 A1 | 12/2016 | Fillingim et al. |
| 2016/0378591 A1 | 12/2016 | Naeimi et al. |
| 2017/0004036 A1 | 1/2017 | Ha et al. |
| 2017/0077955 A1 | 3/2017 | He et al. |

OTHER PUBLICATIONS

Office Action from related Taiwanese patent application No. 107108955, dated Feb. 19, 2012, 21 pages.
Notice of Preliminary Rejection from related Korean Patent Application No. 10-2019-7027923, dated Jun. 26, 2020, 17 pages.

* cited by examiner

| TIER | DECODING |
|---|---|
| 1 | COMPONENT CODE DECODE |
| 2 | INNER CODE DECODE |
| 3 | INNER AND OUTER CODE DECODE |
| 4 | SOFT DECODE |

TIERED ERROR CORRECTION CODE (ECC) OPERATIONS IN MEMORY

PRIORITY INFORMATION

This application is a Continuation of U.S. application Ser. No. 15/461,672, filed on Mar. 17, 2017, the contents of which are incorporated herein by reference.

TECHNICAL FIELD

The present disclosure relates generally to memory devices, and more particularly, to apparatuses and methods for tiered error correction in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIG. 4 is a block diagram of decoding tiers in accordance with a number of embodiments of the present disclosure.

DETAILED DESCRIPTION

Figure 1:
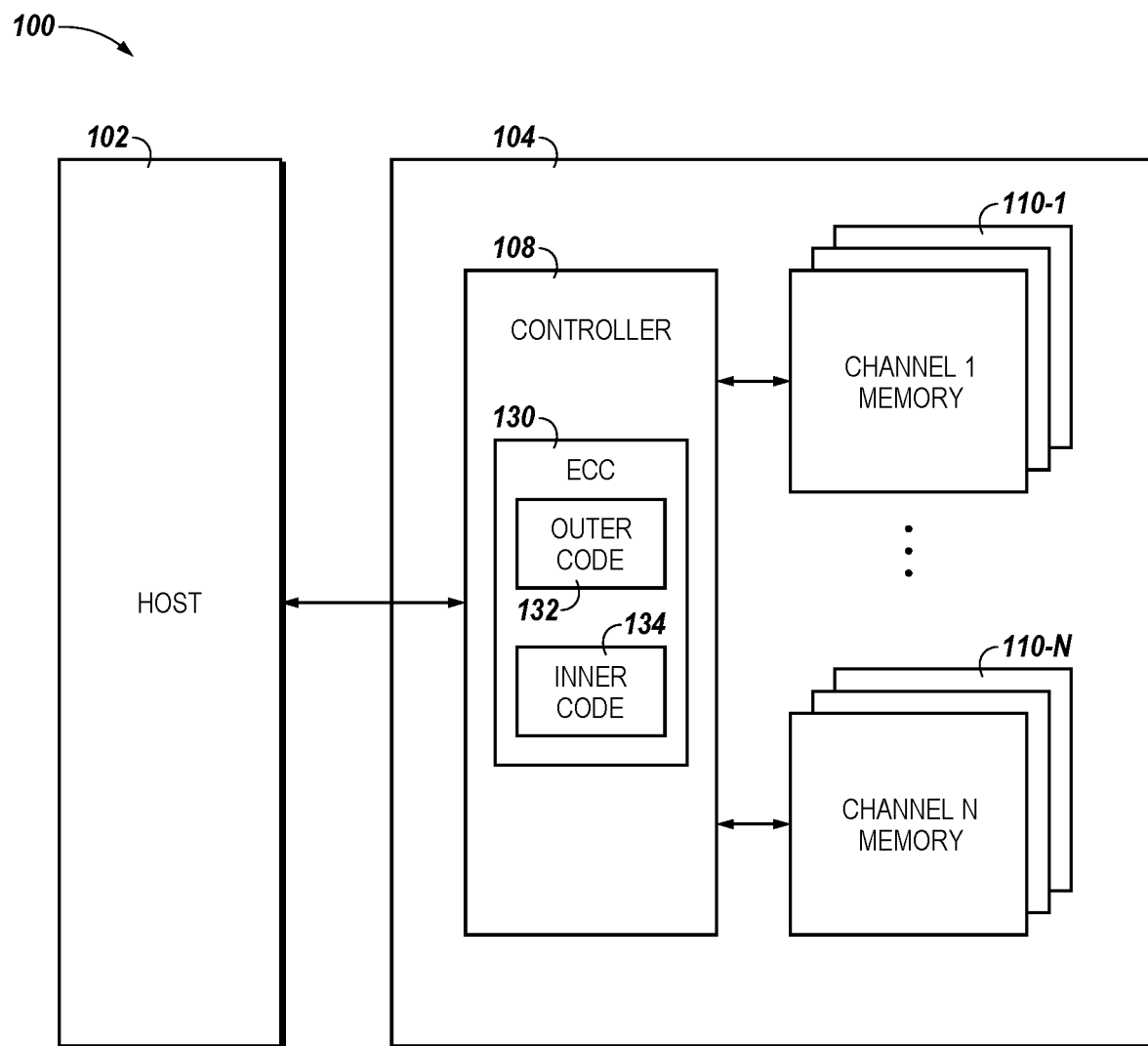
FIG. 1 is a block diagram of an apparatus in the form of a computing system including a memory system in accordance with a number of embodiments of the present disclosure.

Apparatuses and methods for performing an error correction code (ECC) operation are provided. One example method can include performing a first error code correction (ECC) operation on a portion of data, performing a second ECC operation on the portion of data in response to the first ECC operation failing, and performing a third ECC operation on the portion of data in response to the second ECC operation failing.

In one or more embodiments of the present disclosure, a controller can be configured to execute a number of decoding, e.g., ECC, operations on encoded data. A first ECC operation can include using a component code to correct errors via hard data in a component codeword. A second ECC operation can be performed in response to the first ECC operation failing to correct all of the errors in the data. The second ECC operation can be an iterative decoding operation using the block-wise concatenated codewords associated with an inner code. A third ECC operation can be performed in response to the second ECC operation failing to correct all of the errors in the data. The third ECC operation can use codewords associated with an outer code along with the block-wise concatenated codewords associated with an inner code used in the second ECC operation. A fourth ECC operation can be performed in response to the third ECC operation failing to correct all of the errors in the data. The fourth ECC operation can include using soft data to correct the errors in the data. Soft data can be the reliability information, e.g., in addition to the decision whether a codeword bit is zero or one, that represents the confidence of the hard information. The fourth ECC operation is an iterative operation that identifies bits that may be in error based on the soft information and flips a subset of the state of those identified bits. Once the bit or bits have been flipped, an additional ECC operation, e.g., the first ECC operation, the second ECC operation, and/or the third ECC operation, is performed on the data. If the data passes the additional ECC operations, then all errors have been corrected and the ECC decoding operation is complete. If the data does not pass the additional ECC operations, then the state of another subset of bits are flipped and additional ECC operations are performed until all errors are corrected or until a threshold number of trials is reached and/or a threshold number of bits have been flipped.

In a number of embodiments, the first, second, third, and/or fourth ECC operations can each have different latency, power consumption and error correction capability. For example, the first ECC operation can have the lowest latency and power consumption, while having the lowest error correction capability. The second ECC operation can have the next lowest latency and power consumption, while having next lowest error correction capability. The third ECC operation can have the next lowest latency and power consumption, while having the next lowest error correction capability. In a number of embodiments, the first, second, third, and/or fourth ECC operations can be chosen for performance based on a-priori information, such as the health/age of the memory device and/or size of the data, for example. For example, the third ECC operation can be selected to be performed first based on a-priori information. In a number of embodiments, the first, second, third, and/or fourth ECC operations can be chosen for performance using hardware and/or firmware.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of a computing system 100 including an apparatus in the form of at least one memory system 104, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, the memory system 104 can include a controller 108 and one or more memory devices 110-1, ..., 110-N. In this example, the controller 108 is external to the one or more memory devices 110-1, ..., 110-N. The memory devices 110-1, ..., 110-N can provide a storage volume for the memory system, e.g., with a file system formatted to the memory devices. In a number of embodiments, the number of memory devices 110-1, ..., 110-N can include non-volatile memory including a number of logical units (LUNs). A LUN can be a portion of non-volatile memory that can be independently controllable. The controller 108 can include control circuitry, e.g., hardware, firmware, and/or software. In one or more embodiments, the controller 108 can be an application specific integrated circuit (ASIC) coupled to a printed circuit board including a physical interface and memory devices 110-1, ..., 110-N. Also, the controller can include volatile and/or non-volatile memory.

The controller 108 can include hardware, firmware, and/or software to perform ECC 130 operations on data, e.g., to correct errors in the data. For example, errors in the state of a memory cell due to threshold voltage shift can be corrected by ECC 130. ECC operations can include regular ECC operations used to correct errors based only on hard data and advanced ECC operations which can use soft data to correct errors. Whether regular ECC and/or advanced ECC is used can depend on the number of cells that are in error, for instance, e.g., a quantity of erroneous bits.

In a number of embodiments of the present disclosure, ECC 130 operations are performed. Data can be encoded using a first code e.g., an outer code 132, and a second code, e.g., an inner code 134. The first code can be a BCH code and the second code can be a block-wise concatenated product code, for example.

As illustrated in FIG. 1, a host 102 can be coupled to the memory system 104. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

In one or more embodiments, a physical host interface can be in the form of a standardized interface. For example, when the memory system 104 is used for data storage in a computing system 100, a physical host interface can be a serial advanced technology attachment (SATA), peripheral component interconnect express (PCIe), or a universal serial bus (USB), among other connectors and interfaces. In general, however, a physical host interface can provide an interface for passing control, address, data, and other signals between the memory system 104 and a host 102 having compatible receptors for the physical host interface.

The controller 108 can communicate with the memory devices 110-1, ..., 110-N to read, write, and erase data, among other operations. Controller 108 can have circuitry that may be one or more integrated circuits and/or discrete components. A controller could selectively couple an I/O connection (not shown in FIG. 1) of a memory device 110-1, ..., 110-N to receive the appropriate signal at the appropriate I/O connection at the appropriate time. Similarly, the communication protocol between a host 102 and the memory system 104 may be different than what is required for access of a memory device 110-1, ..., 110-N. Controller 108 can translate the commands received from a host into the appropriate commands to achieve the desired access to a memory device 110-1, ..., 110-N.

A memory device 110-1, ..., 110-N can include one or more arrays of memory cells, e.g., non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The memory devices 110-1, ..., 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device.

In a memory device, a physical page can refer to a unit of writing and/or reading, e.g., a number of cells that are written and/or read together or as a functional group of memory cells. An even page and an odd page can be written and/or read with separate writing and/or reading operations. For embodiments including multilevel cells (MLC), a physical page can be logically divided into, for example, an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 110-1, . . . , 110-N. It will be appreciated by those skilled in the art that the number of address input connections can depend on the density and architecture of the memory devices 110-1, . . . , 110-N.

In general, the controller 108 is responsible for converting command packets received from the host 102, e.g., from a PCIe bus, into command instructions for host-memory translation circuitry and for converting memory responses into host system commands for transmission to the requesting host.

In one or more embodiments, data can be written to the memory devices one page at a time. Each page in the memory device can have a number of physical sectors and each physical sector can be associated with a logical block address (LBA). As an example, a physical page can have 8 physical sectors of data. However, embodiments are not limited to a particular number of physical sectors per physical page.

Figure 2:
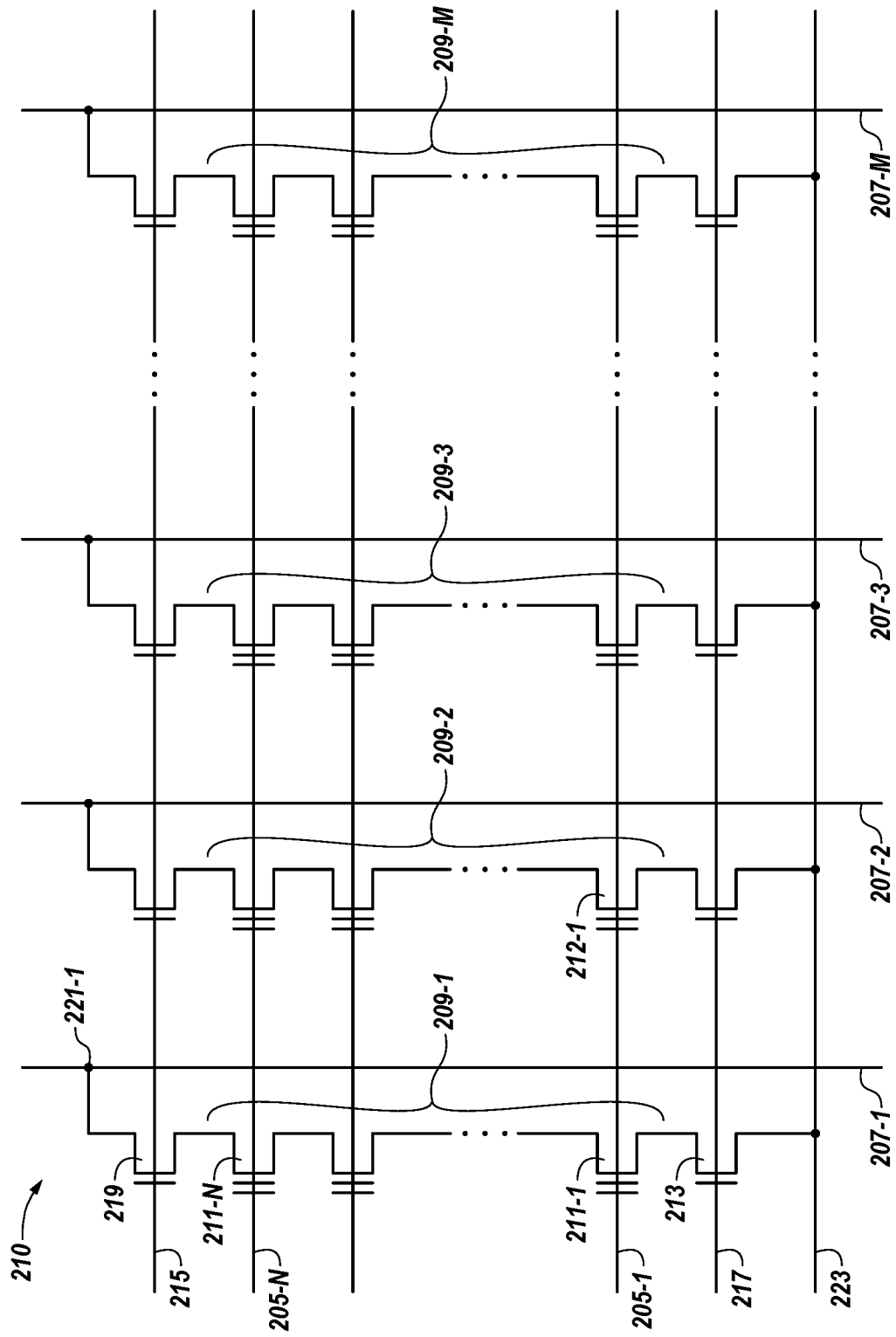
FIG. 2 is a schematic of a portion of memory comprising an array of memory cells operable in accordance with a number of embodiments of the present disclosure.

FIG. 2 is a schematic of a portion of memory 210 comprising an array of memory cells operable in accordance with a number of embodiments of the present disclosure. The embodiment of FIG. 2 illustrates a NAND architecture non-volatile memory array; however, embodiments described herein are not limited to this example. For example, a number of embodiments can implemented to a NOR architecture non-volatile memory array. As shown in FIG. 2, the memory array includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

The memory array includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a select gate source (e.g., a field-effect transistor (FET) 213) and a select gate drain (e.g., FET 219). Each select gate source 213 is configured to selectively couple a respective NAND string to a common source 223 responsive to a signal on source select line 217, while each select gate drain 219 is configured to selectively couple a respective NAND string to a respective bit line responsive to a signal on drain select line 215.

As shown in the embodiment illustrated in FIG. 2, a source of select gate source 213 is coupled to a common source line 223. The drain of select gate source 213 is coupled to the source of the memory cell 211-1 of the corresponding NAND string 209-1. The drain of select gate drain 219 is coupled to bit line 207-1 of the corresponding NAND string 209-1 at drain contact 221-1. The source of select gate drain 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. For example, one end of each memory cell (e.g., a memory cell 211-N as illustrated in FIG. 2) can be coupled to a bit line, and another end of the same memory cell can be coupled to a source line that can be aligned in parallel with the bit line. Furthermore, a NOR architecture can provide for random access to the memory cells in the array (e.g., as opposed to page-based access as with a NAND architecture).

In operation, a number of memory cells coupled to a selected word line (e.g., 205-1, . . . , 205-N) can be written and/or read together as a group. A group of memory cells written and/or read together can be referred to as a page of cells (e.g., a physical page) and can store a number of pages of data (e.g., logical pages). A number of memory cells coupled to a particular word line and programmed together to respective data states can be referred to as a target page. A programming operation can include applying a number of program pulses (e.g., 16V-20V), which correspond to a particular programming algorithm that is being used to program the memory cell, to a selected word line in order to increase the threshold voltage (Vt) of selected cells coupled to that selected word line to a desired voltage level corresponding to a targeted data state.

Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

Figure 3:
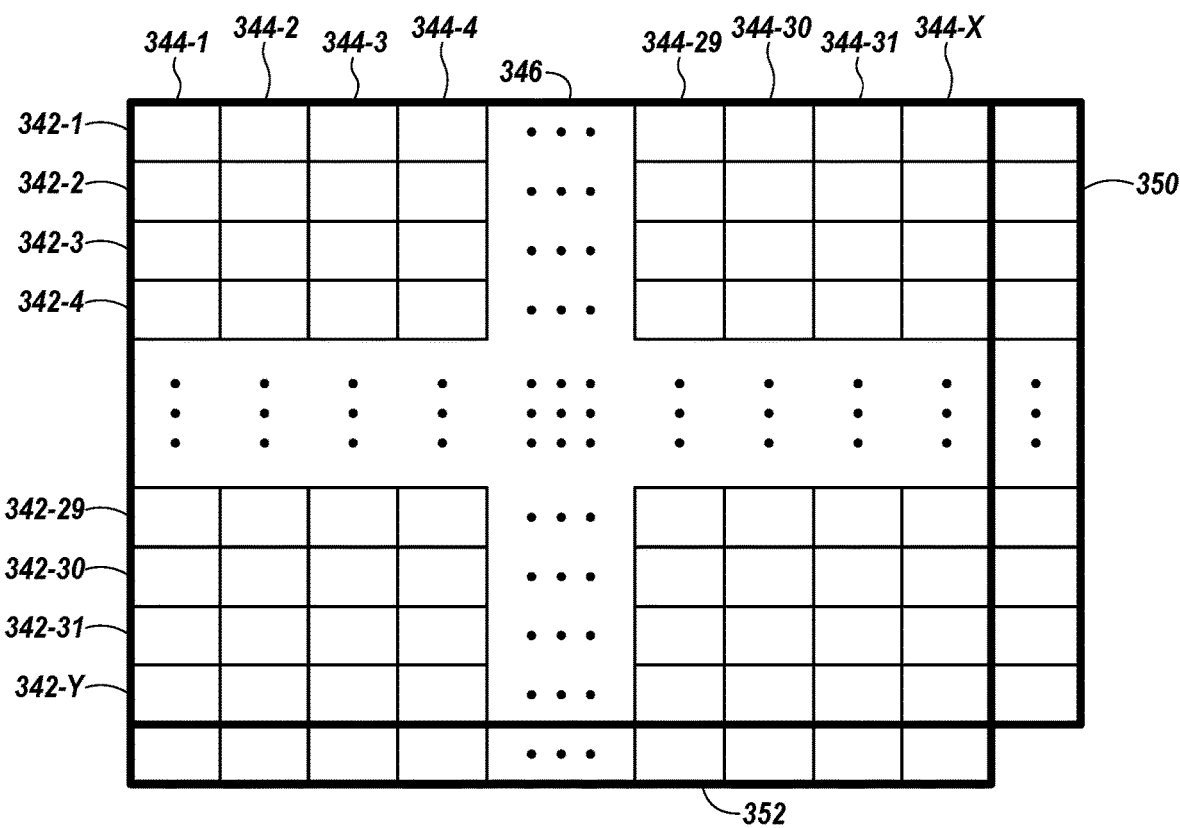
FIG. 3 is a block diagram of encoded data stored in memory in accordance with a number of embodiments of the present disclosure.

FIG. 3 is a block diagram of encoded data stored in memory in accordance with a number of embodiments of the present disclosure. In FIG. 3, data, e.g., user data and parity data of the outer code, is encoded with block-wise concatenated product codes. The encoded data is stored in column component codewords 344-1, . . . , 344-X and row component codewords 342-1, . . . , 342-Y. The encoded data includes ECC payload 346, which includes user data and/or outer code parity data, column component codeword parity data 352, and row component codeword parity data 350. The intersections of the column component codewords 344-1, . . . , 344-X and the row component codewords 342-1, . . . , 342-Y include a block of bits that are protected by the column component codeword and row component codeword at a particular intersection.

FIG. 4 is a block diagram of decoding tiers in accordance with a number of embodiments of the present disclosure. A first tier of ECC 460-1 can include an operation using a component code decode 462 to correct errors via hard data in a component codeword. A second tier of ECC 460-2 can include an operation using an inner code decode 464, which can include an iterative decoding operation using the block-wise concatenated codewords associated with an inner code. A third tier of ECC 460-3 can include an operation using an inner code decode and an outer code decode 466, which can use codewords associated with an outer code along with the block-wise concatenated codewords associated with an inner code used in the second tier of ECC. A fourth ECC operation can be performed in response to the third ECC operation failing to correct all of the errors in the data. The fourth ECC operation can include using soft data to correct the errors in the data. Soft data can be the reliability information, e.g., in addition to the decision whether a codeword bit is zero or one, that represents the confidence of the hard information. The fourth ECC operation is an iterative operation that identifies bits that may be in error based on the soft information at the intersections of the component codewords that failed to decode in the second ECC operation and flips a subset of the state of those identified bits. Once the bit or bits have been flipped, an additional ECC operation, e.g., the first ECC operation, the second ECC operation, and/or the third ECC operation, is performed on the data. If the data passes the additional ECC operations, then all errors have been corrected and the ECC decoding operation is complete. If the data does not pass the additional ECC operations, then the state of another subset of bits are flipped and additional ECC operations are performed until all errors are corrected or until a threshold number of trials is reached and/or a threshold number of bits have been flipped.

The fourth tier of ECC 460-4 can be performed in response to an error occurring one or more intersections of column codewords and row codewords. A list of bit flip candidates can be created. The bit flip candidates are selected from the bits at the intersections of the row codewords and column codewords where and error or errors remain. The bits in bit flip candidate list can be selected based on their log likelihood ratio (LLR), which is an indication of the likelihood that a particular bit is in error. The higher LLR magnitude for a bit indicates that the bit is less likely to be in errors. The bit flip candidate list can include all bits that are below a particular LLR, for example. A particular number of bits from the bit flip candidate list can be flipped and then an additional ECC operation can be performed on the data with the bits flipped to correct any remaining errors. If the additional ECC operation is successful at correcting the remaining errors, the tiered ECC operation can be complete. If the additional ECC operation is unsuccessful, another number of bits from the bit flip candidate list can be flipped and another ECC operation can be performed.

For example, a bit flip candidate list can include X bits and during the fourth tier of ECC decoding Y bits can be flipped at a time, so that XchooseY bit flip permutations can be by tried until the ECC operation is successful at correcting the remaining errors or until a threshold number of bit flip permutations have been tried.

In a number of embodiments, the first tier of ECC 460-1 can be used on data that is 64 B in size. If the size of the data is larger than 64B, such as 4 kB for example, the first tier of ECC 460-1 can be skipped and an ECC process can start with the second tier of ECC 460-2.

Each successive tier of ECC can be initiated upon the previous tiers of ECC being unable to correct errors in the data. For example, the second tier of ECC 460-2 can be performed in response to the first tier of ECC 460-1 failing to correct all of the errors in the data. The third tier of ECC 460-3 can be performed in response to the second tier of ECC 460-2 failing to correct all of the errors in the data. The fourth tier of ECC 460-4 can be performed in response to the third tier of ECC 460-3 failing to correct all of the errors in the data. The first tier of ECC 460-1 can have the lowest latency, power consumption, and correction capability of the tiers of ECC. Each successive tier can have greater latency, power consumption, and correction capability, therefore using the tiers of ECC can allow the system to corrects errors using only an amount of latency and power that is necessary to correct errors that are present in the data. Also, each of the tiers of ECC can be implemented via hardware, such that that the tier used to perform the ECC operation is selected automatically. The tiers of ECC can also be selected manually, where firmware can be used to select the tiers of ECC that will be used to correct errors in the data.

Figure 5:
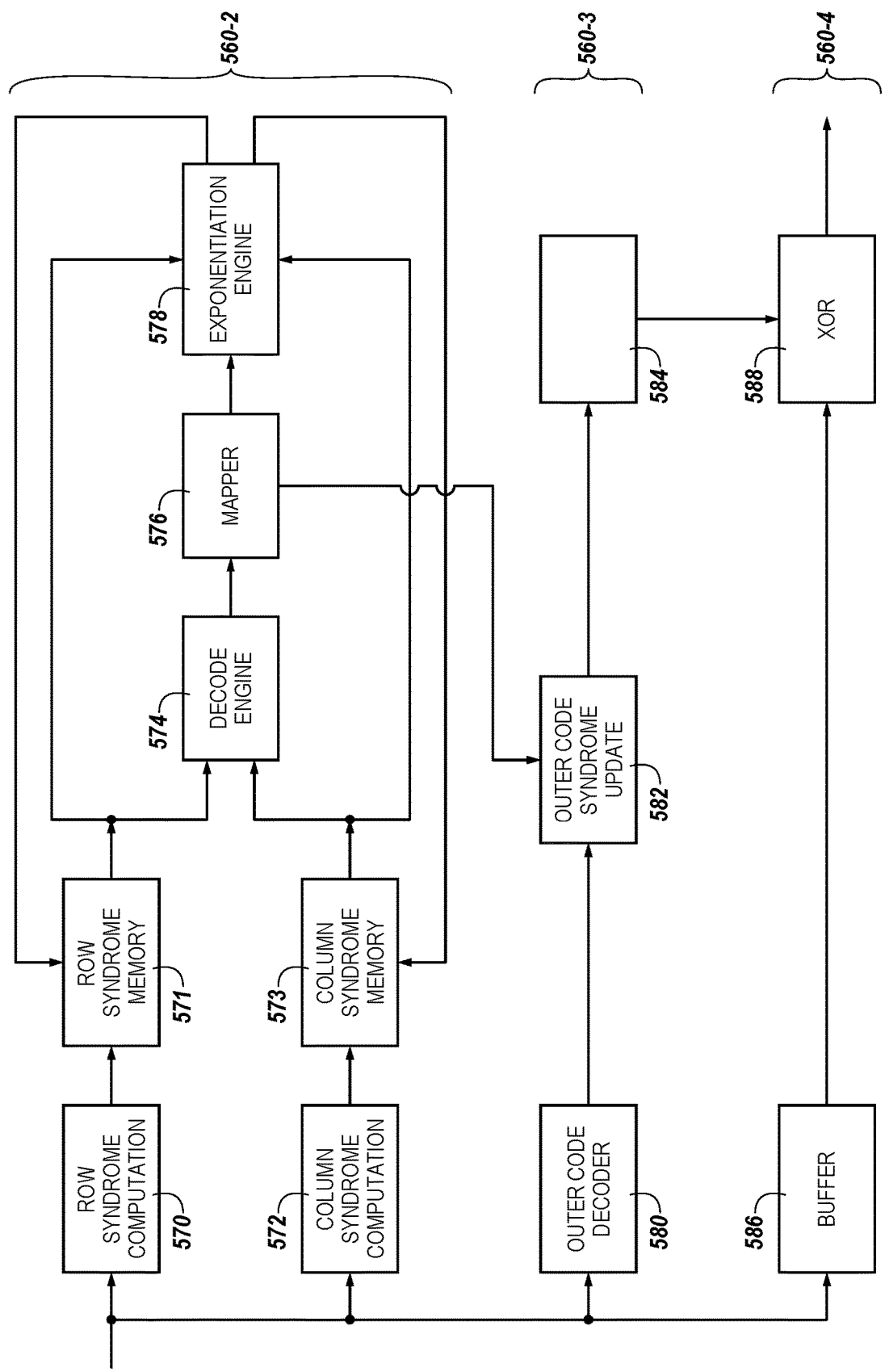
FIG. 5 is a functional block diagram of decoding components in accordance with a number of embodiments of the present disclosure.

FIG. 5 is a functional block diagram of decoding components in accordance with a number of embodiments of the present disclosure. Second tier decoding components 560-2 can include a row syndrome computation component 570, row syndrome memory 571 to store the row syndrome as it is computed, a column syndrome computation component 572, and column syndrome memory 573 to store the columns syndrome as it is computed. The decode engine 574 can use the column syndrome and the row syndrome to correct errors in the data based on the inner code. Errors that are corrected by decode engine 574 are mapped 576 to the outer code syndrome 582. The exponentiation engine 578 can update the row syndrome memory 571 and the column syndrome memory 573 based on the errors corrected by decode engine 574. The second tier ECC process can be iterative until decode engine 574 reaches an error floor and is no longer able to correct the remaining errors in the data or reaches a threshold number of trials in the iterative decoding scheme.

Third tier decoding components 560-3 include outer code decoder 580 to generate the syndromes for the outer code and component 584 (e.g., Berlekamp and/or Chien search devices) to correct errors based on the outer code. The third tier decoding components also include the updated outer code syndrome 582 based errors that were corrected by the second tier ECC.

Components 560-4 include a buffer 586 to store the data and logic to perform XOR operations 588. Buffer 586 can store the codewords where the remaining errors are located and the codewords stored in buffer 586 can be corrected based on the fourth tier decoding operation. The bits for the bit flip candidate list can be selected from the bits stored in buffer 586 based on the intersections of the component codewords that failed to decode. A particular number of bits from the bit flip candidate list can be flipped and then an additional ECC operation can be performed on the data with the bits flipped to correct any remaining errors. If the additional ECC operation is successful at correcting the remaining errors, the tiered ECC operation can be complete and the codewords in buffer 586 can be updated.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
performing a first error code correction (ECC) operation on data read from a memory array;
performing a second ECC operation on the data in response to the first ECC operation failing;
performing a third ECC operation on the data in response to the second ECC operation failing; and
iteratively performing a fourth ECC operation on the data in response to the third ECC operation failing until a threshold number of bits is flipped.

2. The method of claim 1, wherein performing the fourth ECC operation includes using an iterative product code decoder or an outer BCH decoder on codewords that have been changed in response to the codewords failing the third ECC operation.

3. The method of claim 1, wherein performing the third ECC operation includes performing an operation using an inner code decode and an outer code decode.

4. The method of claim 1, wherein performing the third ECC operation includes using codewords associated with an outer code along with a block-wise concatenated codeword associated with an inner code used in the second ECC operation.

5. The method of claim 1, wherein performing the third ECC operation includes performing ECC operations on codewords that failed the second ECC operations and include changed bits from a bit flip candidate list selected based on a log likelihood ratio.

6. The method of claim 1, wherein performing the second ECC operation includes generating a bit flip candidate list that includes bits at an intersection of a row codeword and a column codeword that failed the previous ECC operation based on a log likelihood ratio.

7. The method of claim 1, further comprising performing additional ECC operations on codewords that failed previous ECC operations and include changed bits from the bit flip candidate list until one of the additional ECC operations is successful or until a threshold number of additional ECC operations are performed.

8. An apparatus, comprising:
a memory device;
a controller coupled to the memory device configured to:
perform a first error code correction (ECC) operation on data;
perform a second ECC operation using an inner code decode on the data in response to the first ECC operation failing; and
perform a third ECC operation using an inner code decode and an outer code decode, wherein the third ECC operation includes code words associated with the outer code along with block-wise concatenated codewords associated with the inner code.

9. The apparatus of claim 8, further comprising the controller configured to perform one or more additional ECC operations in response to the third ECC operation failing.

10. The apparatus of claim 9, wherein:
the additional ECC operations are soft decoding operations;
the controller is configured to;
perform the additional ECC operations on codewords that failed previous ECC operations; and
include changed bits from a bit flip candidate list selected based on a log likelihood ratio until one of the additional ECC operations is successful or until a threshold number of additional ECC operations are performed.

11. The apparatus of claim 9, wherein the controller is configured to perform another of the previous first or second ECC operations on data in response to the third ECC operation failing.

12. The apparatus of claim 9, wherein the controller is configured to perform a fourth ECC operation that includes generating a bit flip candidate list using log likelihood ratio masking, wherein the bit flip candidate list includes bits from intersections of component codewords that failed the first, the second, and the third ECC operations.

13. The apparatus of claim 9, wherein the first ECC operation has a latency that is less than the second ECC operation and the third ECC operation and a fourth ECC operation has an error correction capability and a latency that is greater than the first, the second, and the third ECC operations.

14. The apparatus of claim 9, wherein the controller is configured to perform the first ECC operation using hard data in a component code word to correct errors in the data.

15. A method, comprising:
performing a first error code correction (ECC) operation on data read from a memory array; and
performing a second ECC operation on the data in response to the first ECC operation failing and comprising creating a list of bit flip candidates responsive to an error occurring at one or more intersections of column codewords and row codewords.

16. The method of claim 15, further comprising creating the list of bit flip candidates using bit flip candidates selected from bits at the one or more intersections of the row codewords and column codewords where an error remains.

17. The method of claim 15, further comprising creating the list of bit flip candidates based on their respective log likelihood ratios.

18. The method of claim 15, further comprising creating the list of bit flip candidates comprising all bits that are below a particular log likelihood ratio.

19. The method of claim 15, further comprising:
flipping a particular number of bits from the bit flip candidate list; and performing an additional ECC operation on the data with the flipped particular number of bits.

20. The method of claim 19, further comprising flipping a different particular number of bits from the bit flip candidate list responsive to the additional ECC operation being unsuccessful; and performing another additional ECC operation on the data with the flipped different particular number of bits.

* * * * *